United States Patent

Stifter

[11] 4,075,560
[45] Feb. 21, 1978

[54] EXPANDED SCALE ELECTRICAL MEASURING CIRCUIT

[76] Inventor: Francis J. Stifter, 171 South Main St., Natick, Mass. 01760

[21] Appl. No.: 749,286

[22] Filed: Dec. 10, 1976

Related U.S. Application Data

[63] Continuation of Ser. No. 555,065, March 3, 1975, abandoned.

[51] Int. Cl.² .......................................... G01R 15/08
[52] U.S. Cl. ..................................... 324/131; 324/115
[58] Field of Search ........................ 324/132, 131, 115

[56] References Cited

U.S. PATENT DOCUMENTS

| | | | |
|---|---|---|---|
| 2,584,800 | 2/1952 | Grisdale | 324/110 |
| 3,263,170 | 7/1966 | Schneider | 324/131 |

*Primary Examiner*—Rudolph V. Rolinec
*Assistant Examiner*—Ernest F. Karlsen
*Attorney, Agent, or Firm*—John E. Toupal

[57] ABSTRACT

An expanded scale measuring circuit including a four-arm bridge having a pair of input terminals for connections to a source of input voltage to be measured and a pair of measuring terminals between which are connected a current responsive meter. Located in one pair of the bridge arms are a resistor and diode that establish a reference voltage at one of the measuring terminals. The other pair of arms are formed by a voltage divider network including a zener diode that establishes a fixed reduction in the portion of input voltage applied to the other measuring terminal and therefore in the voltage appearing across the meter. By appropriately selecting resistance values for the divider network, a zero meter current condition is established for an input voltage at the bottom of a range of interest.

9 Claims, 1 Drawing Figure

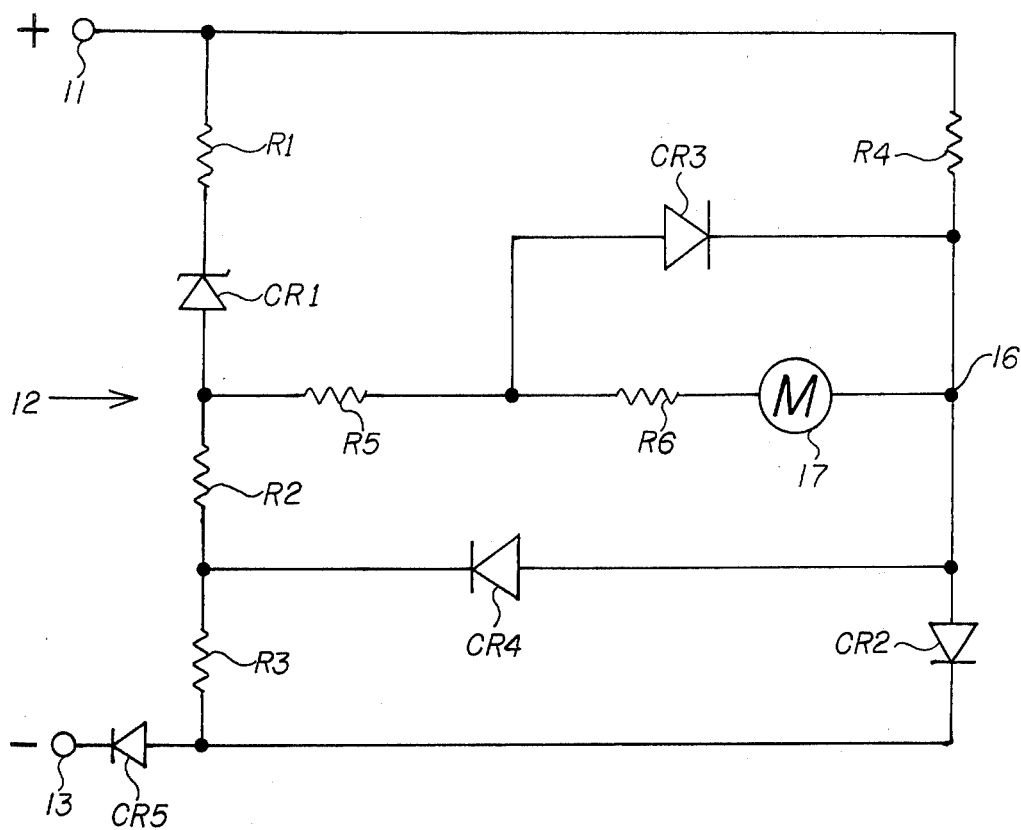

4,075,560

EXPANDED SCALE ELECTRICAL MEASURING CIRCUIT

CROSS-REFERENCE TO RELATED APPLICATION

This invention is a continuation of U.S. application Ser. No. 555,065, filed Mar. 3, 1975, now abandoned, and entitled "Expanded Scale Electrical Measuring Circuit".

BACKGROUND OF THE INVENTION

This invention relates generally to voltage measuring circuits and, more particularly, to a voltage measuring circuit with an expanded scale.

In many instances an observer is interested only in the magnitude of a voltage existing between certain known limits well above zero and would like to easily determine values within those limits without the requirement for an excessively large meter. For these reasons circuits commonly known as expanded scale meter circuits have been developed. In the usual electrical indicating meter or instrument, there are a definite number of parts per division throughout the range or length of the scale for a given measured quantity. With an expanded scale circuit or meter, a certain portion of the measured quantity is selected and indicated on the meter with the same number of parts per division over the scale length, thereby providing higher readability of that selected portion than is possible without the scale expansion.

Known expanded scale devices include some employing highly complex circuitry and others that obtain expansion by mechanically suppressing an indicator at near zero voltage values. Also known is the use of a constant voltage device such as a gaseous discharge tube in series with a meter. Although extremely simple, this latter arrangement does not offer the accuracy needed in many applications.

The object of this invention, therefore, is to provide a relatively simple, low cost expanded scale instrument that exhibits a high degree of measuring accuracy in a specific range of interest.

SUMMARY OF THE INVENTION

The expanded scale measuring circuit of this invention includes a four-arm bridge having a pair of input terminals for connection to a source of input voltage to be measured and a pair of measuring terminals between which are connected a current responsive meter. Located in one pair of the bridge arms are a resistor and diode that establish a reference voltage at one of the measuring terminals. The other pair of arms are formed by a voltage divider network including a zener diode that establishes a fixed reduction in the portion of input voltage applied to the other measuring terminal and therefore in the voltage appearing across the meter. By appropriately selecting resistance values for the divider network, a zero meter current condition is established for an input voltage at the bottom of a range of interest. The combination of the zener diode and voltage divider network in the bridge arrangement provides in a relatively simple circuit an expanded scale device exhibiting a high degree of accuracy.

A preferred embodiment of the invention includes a plurality of protective diodes connected in such a way as to prevent meter damage by either overvoltage or undervoltage as well as by an input voltage of reversed polarity. Because of such protection, meter accuracy is insured regardless of the circuit conditions to which it is exposed.

DESCRIPTION OF THE DRAWING

These and other objects and features of the invention will become more apparent upon a perusal of the following description taken in conjunction with the accompanying drawing which is a schematic circuit diagram illustrating the invention.

DESCRIPTION OF THE PREFERRED EMBODIMENT

Referring now to the drawing there is shown a positive input terminal 11 connecting ends of two arms of a four-arm bridge network 12 and a negative input terminal 13 connecting ends of another two arms thereof. Opposite ends of the arms are connected by a first measuring terminal 15 and a second measuring terminal 16. One pair of arms between the input terminals 11 and 13 is a voltage divider network including a zener diode CR1 and resistor R1 in a first arm and a pair of resistors R2 and R3 in a second arm. Another resistor R4 and a diode CR2, respectively, are connected in the other pair of arms between the input terminals 11 and 13. Bridging the terminals 15 and 16 is a measuring circuit including a pair of measuring resistors R5 and R6 connected in series with a meter 17. A diode CR3 is connected across the meter 17 between the terminal 16 and a junction between the resistors R5 and R6 while another diode CR4 is similarly connected across the meter 17 between the terminal 16 and a junction between the voltage divider resistors R2 and R3. Finally, a diode CR5 is connected between input terminal 13 and the bridge network 12.

In operation, the components R4 and CR2 establish a fixed reference voltage of, for example, 0.7 volts at the measuring terminal 16. The zener diode CR1 provides a fixed reduction of, for example, 9 volts in the portion of the input voltage that is applied to the other measuring terminal 15, while the divider resistors R1, R2 and R3 are selected to establish a zero voltage between the terminals 15 and 16 for an input voltage value, for example, 10 volts at the bottom of a particular range of interest. Similarly, the total value of the resistors R5 and R6 is selected to provide a current flow that establishes full scale deflection of the meter 17 for an input voltage, for example, 15 volts at the top of the range of interest. Thus, the meter 17 experiences full scale deflection over a selected range of input voltages of, in this case, 10–15 volts.

The diode CR3 prevents damage to the meter 17 in the event of excessively large input voltages by shunting the meter at a given meter current value established by suitable selection of the resistor R6. Similarly, possibly damaging reverse current flow through the meter 17 in response to input voltages less than the breakdown voltage of the zener diode CR1 is prevented by the diode CR4. Finally, the diode CR5 prevents excessive current flow through the meter 17 in the event that the input terminals 11 and 13 are inadvertently reversed to establish a reverse voltage across the bridge network 12. Because of the diodes CR3, CR4 and CR5, damage to the meter 17 is prevented and meter accuracy retained regardless of the voltages applied to the input terminals 11 and 13.

Obviously, many modifications and variations of the present invention are possible in light of the above teachings. It is to be understood, therefore, that the invention can be practiced otherwise than as specifically described.

What is claimed is:

1. A measuring circuit comprising:
a four-arm bridge having a pair of input terminals for connection to a source of input voltage to be measured, each of said input terminals connecting ends of a different pair of the arms of said bridge;
a first measuring terminal connecting opposite ends of one pair of arms comprising one arm in each of said different pairs of arms;
a second measuring terminal connecting opposite ends of another pair of arms comprising the other arms in each of said different pairs of arms;
voltage divider means in said one pair of arms, said voltage divider means comprising in a first arm of said one pair of arms a series combination of a linear resistor and a voltage regulator semiconductor means for producing a fixed reduction in the portion of said input voltage applied to said first measuring terminal;
voltage reference means in said another pair of arms, said voltage reference providing a fixed reference voltage at said second measuring terminal; and
measuring means connecting said first and second measuring terminals.

2. A circuit according to claim 1 wherein said voltage regulator semiconductor comprises a zener diode.

3. A circuit according to claim 2 wherein said measuring means comprises a current responsive meter.

4. A circuit according to claim 3 wherein said voltage reference means comprises a resistor in one arm of said other pair of arms, and a diode in the other arm thereof.

5. A circuit according to claim 3 including overvoltage means for protecting said meter from excessive voltage of one polarity, and undervoltage means for protecting said meter from voltage of the opposite polarity.

6. A circuit according to claim 5 wherein said overvoltage means comprises a first diode connected across said meter so as to be forward biased by said one polarity, and said undervoltage means comprises a second diode connected across said meter so as to be forward biased by said opposite polarity.

7. A circuit according to claim 6 wherein said measuring means further comprises a pair of measuring resistors connected in series with said meter and having a junction connected to said first diode.

8. A circuit according to claim 7 wherein said voltage divider means further comprises a pair of series connected divider resistors in the other arm of said one pair of arms, a junction between said divider resistors being connected to said second diode.

9. A circuit according to claim 8 including a reverse voltage protecting diode connected to one of said input terminals.

* * * * *